(12) United States Patent
Yan et al.

(10) Patent No.: US 12,557,435 B2
(45) Date of Patent: Feb. 17, 2026

(54) ELECTRONIC DEVICE

(71) Applicant: InnoLux Corporation, Miao-Li County (TW)

(72) Inventors: Tzu-Min Yan, Miao-Li County (TW); Chun-Hsien Lin, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 628 days.

(21) Appl. No.: 17/952,350

(22) Filed: Sep. 26, 2022

(65) Prior Publication Data

US 2023/0132292 A1    Apr. 27, 2023

(30) Foreign Application Priority Data

Oct. 26, 2021    (CN) .......................... 202111248980.3

(51) Int. Cl.
*H10H 20/01* (2025.01)
*H01L 25/075* (2006.01)
*H10H 20/857* (2025.01)

(52) U.S. Cl.
CPC ......... *H10H 20/01* (2025.01); *H01L 25/0753* (2013.01); *H10H 20/857* (2025.01); *H10H 20/0364* (2025.01)

(58) Field of Classification Search
CPC ... H10H 20/01; H10H 20/857; H10H 20/0364

USPC ............................................................ 438/4
See application file for complete search history.

(56) References Cited

U.S. PATENT DOCUMENTS

| | | | |
|---|---|---|---|
| 2004/0076382 A1* | 4/2004 | Saia | G02B 6/138 |
| | | | 385/92 |
| 2011/0155438 A1* | 6/2011 | Ito | H05K 3/4007 |
| | | | 174/261 |
| 2015/0325489 A1 | 11/2015 | Miyata | |
| 2017/0162552 A1* | 6/2017 | Thompson | H10H 20/825 |
| 2018/0114878 A1* | 4/2018 | Danesh | H10H 20/01 |
| 2018/0323356 A1* | 11/2018 | Lin | H01L 23/49838 |
| 2019/0206834 A1* | 7/2019 | Gomes | H01L 25/0652 |
| 2019/0386173 A1* | 12/2019 | Chen | H10H 20/812 |
| 2020/0152826 A1 | 5/2020 | Lee | |
| 2021/0183828 A1 | 6/2021 | Chae | |

FOREIGN PATENT DOCUMENTS

| | | |
|---|---|---|
| CN | 111599833 A | 8/2020 |
| TW | 201743440 A | 12/2017 |

* cited by examiner

*Primary Examiner* — Igwe U Anya
(74) *Attorney, Agent, or Firm* — Winston Hsu

(57) ABSTRACT

An electronic device with an active region comprising a substrate; a first conducting layer, disposed on the substrate, comprising a first pad in the active region; a second conducting layer, disposed on the first conducting layer, comprising a second pad in the active region; a first electronic component, disposed on the first pad, and electronically connected to the first pad; and a second electronic component, disposed on the second pad, and electronically connected to the second pad.

10 Claims, 11 Drawing Sheets

ELECTRONIC DEVICE

BACKGROUND OF THE DISCLOSURE

1. Field of the Disclosure

The present disclosure is related to an electronic device, and more particularly, to an electronic device capable of integrating multiple pads on the same substrate.

2. Description of the Prior Art

Various tiny components may be transferred to a substrate via mass transfer techniques, which makes the substrate an interface for integrating various components. However, different components may be suitable for different mass transfer techniques or bonding metal configurations. Thus, how to integrate multiple pads suitable for different mass transfer techniques on the same substrate is a problem to be solved.

SUMMARY OF THE DISCLOSURE

One embodiment of the present disclosure discloses an electronic device with an active region comprising a substrate; a first conducting layer, disposed on the substrate, comprising a first pad in the active region; a second conducting layer, disposed on the first conducting layer, comprising a second pad in the active region; a first electronic component, disposed on the first pad, and electronically connected to the first pad; and a second electronic component, disposed on the second pad, and electronically connected to the second pad.

Another embodiment of the present disclosure discloses a method of producing an electronic device with an active region. The method comprises providing a substrate; forming a first conducting layer comprising a first pad in the active region, on the substrate; forming a second conducting layer comprising a second pad in the active region, on the first conducting layer; disposing a first electronic component on the first pad, so that the first electronic component is electronically connected to the first pad; and disposing a second electronic component on the second pad, so that the second electronic component is electronically connected to the second pad.

These and other objectives of the present disclosure will no doubt become obvious to those of ordinary skill in the art after reading the following detailed description of the embodiment that is illustrated in the various figures and drawings.

DETAILED DESCRIPTION

Figure 1:
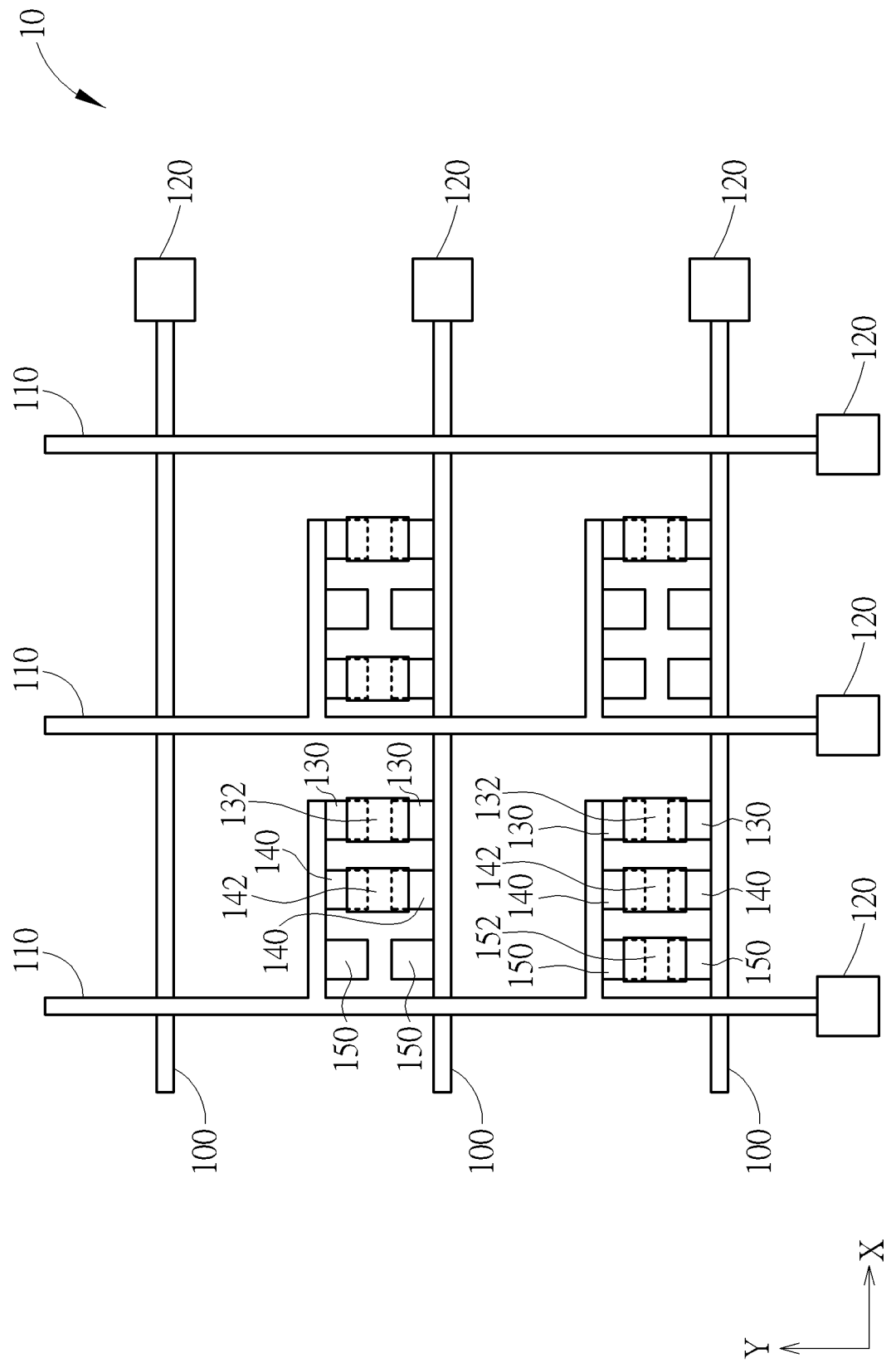
FIG. 1 shows an electronic device according to the embodiment of the present disclosure.

The present disclosure may be understood by reference to the following detailed description, taken in conjunction with the drawing as described below. It is noted that, for purposes of illustrative clarity and being easily understood by the readers, various drawings of this disclosure show a portion of the electronic device, and certain elements in various drawings may not be drawn to scale. In addition, the number and dimension of each component shown in drawings are only illustrative and are not intended to limit the scope of the present disclosure.

Certain terms are used throughout the description and following claims to refer to particular components. As those skilled in the art will understand, electronic equipment manufacturers may refer to a component by different names. This document does not intend to distinguish between components that differ in name but not function.

In the description and the claims, the terms "include", "comprise" and "have" are used in an open-ended fashion, and thus should be interpreted to mean "include but not limited to . . . ".

The directional terms mentioned in the specification such as "up", "down", "front", "back", "left", "right", etc., only refer to the directions of the figures. Thus, the directional terms are used for description, and are not used to limit the present disclosure. The figures illustrate the general features of methods, structures and/or materials used in specific embodiments. However, these figures should not be explained to define or limit the scope or characteristic encompassed by the embodiments. For example, relative sizes, thicknesses and positions of each layer, region and/or structure may be reduced or enlarged.

It will be understood that when an element or layer is referred to as being "on" or "coupled to" another element or layer, it can be directly on or directly coupled to the other element or layer, or intervening elements or layers may be presented. In contrast, when an element is referred to as being "directly on" or "directly coupled to" another element or layer, there are no intervening elements or layers presented. When an element or layer is referred to as being "electronically connected to" another element or layer, it may be directly electronically connected or indirectly electronically connected through other component. The terms "joining" and "connecting" may include the case that both structures are movable, or that both structures are fixed.

The terms "equal to" or "substantially" generally means within 20% of a stated value or range, or within 10%, 5%, 3%, 2%, 1% or 0.5% of the stated value or range.

The term "a range from a first value to a second value" means that the range includes the first value, the second value and other values between the first value and the second value.

Although the terms "first", "second", "third", . . . may be used to describe various elements, the elements may not be limited by the terms. The terms are simply used for distinguishing a single element from other elements in the specification. The same terms may not be used in the claims, and may be replaced by "first", "second", "third", . . . in the order in which the elements recited in the claims. Thus, in the following description in the specification, a first element recited in the claims may be a second element.

It should be noted that the technical features in different embodiments described in the following can be replaced, recombined, or mixed with one another to constitute another embodiment without departing from the spirit of the present disclosure.

FIG. 1 shows an electronic device 10 according to the embodiment of the present disclosure. In FIG. 1, an X axis and a Y axis are perpendicular to each other. The electronic device 10 includes a plurality of first signal lines 100 parallel to the X axis and a plurality of second signal lines 110 parallel to the Y axis. Each of the plurality of first signal lines 100 and each of the plurality of second signal lines 110 may be connected to a plurality of circuits 120. The plurality of circuits 120 may be an integrated circuit (IC), a chip on film (COF) or a flexible printed circuit (FPC), but not limited thereto. The plurality of first signal lines 100 and the plurality of second signal lines 110 are interlaced to define a plurality of regions. Each of the plurality of regions includes a plurality of pads, and the plurality of first signal lines 100 and the plurality of second signal lines 110 are electronically connected to the plurality of pads. The structure or the material of each of the plurality of pads may be the same or different, and may be used for different mass transfers, respectively. Each of the plurality of pads may be electronically connected to other pads. Take FIG. 1 as an example. Each of the plurality of regions defined by the plurality of first signal lines 100 and the plurality of second signal lines 110 includes three pads (i.e., a pad 130, a pad 140 and a pad 150). The pad 130 may be used as a junction for a mass transfer of an electronic component 132. The pad 140 may be used as a junction for repairing an electronic component 142 when the electronic component 132 is damaged or of poor quality. The pad 150 may be used as a junction for another mass transfer of an electronic component 152, or may be used as a backup pad or a test pad. In some embodiments, the three pads (i.e., the pad 130, the pad 140 and the pad 150) may be used as junctions of different mass transfers. For example, different mass transfers may be mass transfers for different electronic components, and may be mass transfers for different process methods such as a fluid transfer or a pick-and-place transfer, but is not limited thereto.

Figure 2:
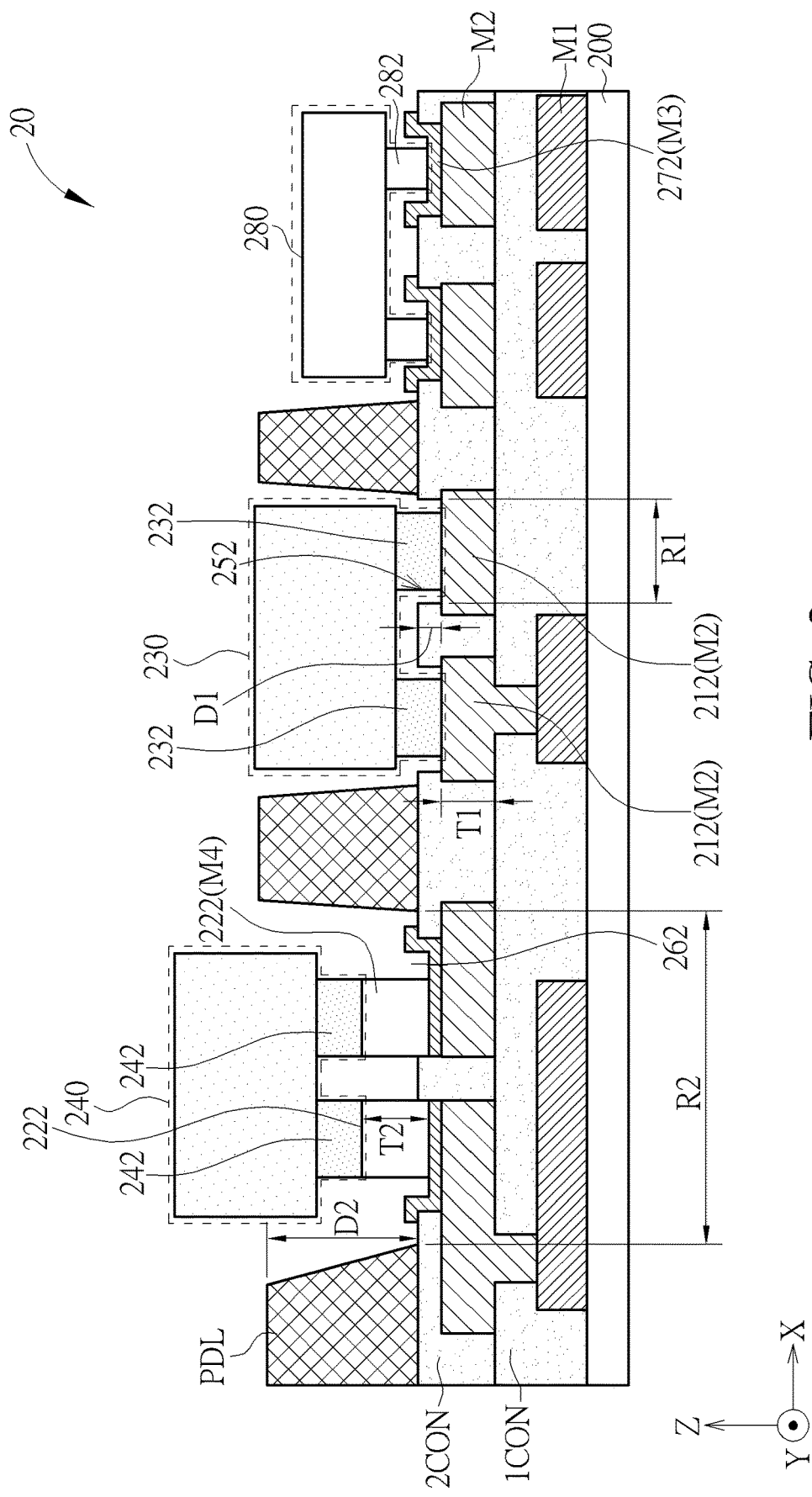
FIG. 2 shows an electronic device according to the embodiment of the present disclosure.

FIG. 2 shows an electronic device 20 according to the embodiment of the present disclosure. The electronic device 20 includes an active region. The active region is a region for the electronic device 20 to perform functions. For example, when the electronic device 20 is a display device, the active region may be a display area. When the electronic device 20 is a sensing device, the active region may be a sensing area. When the electronic device 20 is an antenna device, the active region may be an actuation area (i.e., a receiving area and a transmitting area). The electronic device 20 may include a substrate 200, a conducting layer M1, a conducting layer M2, a conducting layer M3, a conducting layer M4, a first electronic component 230 and a second electronic component 240. As shown in FIG. 2, an X axis, a Y axis and a Z axis are perpendicular to each other, wherein a direction of the Z axis is the same as a normal direction of the substrate 200. The conducting layer M1 may be disposed on the substrate 200 and may include the plurality of first signal line 100. The conducting layer M2 may be disposed on the conducting layer M1 and may include the plurality of second signal line 110. The conducting layer M2 includes a first pad 212 in the active region. The conducting layer M3 may be disposed on the conducting layer M2. The conducting layer M4 may be disposed on the conducting layer M3. The conducting layer M4 includes a second pad 222 in the active region. The first electronic component 230 may be disposed on the first pad 212, and includes a first pin 232. The first electronic component 230 is electronically connected to the first pad 212 (of the conducting layer M2) via the first pin 232. The second electronic component 240 may be disposed on the second pad 222, and includes a second pin 242. The second electronic component 240 is electronically connected to the second pad 222 (of the conducting layer M4) via the second pin 242. The first electronic component 230 and the second electronic component 240 may be passive components or active components such as resistors, capacitors (including antenna units), inductors, transistors or diodes (including photodiodes and light emitting diodes (LEDs)), but are not limited thereto.

In some embodiments, a state of an electronic component is a normal state, and a state of another electronic component is a defective state. In detail, when an electronic component is damaged or of poor quality, it is not necessary to remove the electronic component. Instead, a laser cutting may be used to open a circuit of the electronic component, and another electronic component may be disposed on another pad as a repair. Thus, a state of the electronic component on the substrate 200 is the defective state (i.e., the electronic component is damaged, of poor light-emitting quality, or disconnected and cannot emit light), and a state of another electronic component is the normal state (i.e., the electronic component is not damaged and of good light-emitting quality). For example, on the same substrate 200, the state of the first electronic component 230 may be the normal state, and the state of the second electronic component 240 may be the defective state. On the contrary, on the same substrate 200, the state of the first electronic component 230 may be the defective state, and the state of the second electronic component 240 may be the normal state.

In some embodiments, the first pad 212 and the second pad 222 may include different materials. For example, the first pad 212 and the second pad 222 may include different metal configurations such as copper, tin, indium, gold, titanium, indium tin oxide (ITO), other suitable material or a combination of the above, but is not limited thereto. In some embodiments, the first pad 212 has a thickness T1, and the second pad 222 has a thickness T2. The thickness T1 of the first pad 212 and the thickness T2 of the second pad 222 may be in a range of 0.05 μm to 10 μm, but is not limited thereto. It should be noted that the thickness T1 and the thickness T2 are defined as thicknesses measured along the normal direction of the substrate 200 (i.e., along the Z axis) of the pad (i.e., the first pad 212 and the second pad 222) of the conducting layer (i.e., the conducting layer M2 and the conducting layer M4) electronically connected with the electronic components. In some embodiments, the thickness T1 of the first pad 212 and the thickness T2 of the first pad 222 are different.

In some embodiments, the electronic device 20 may further include an insulating layer 1CON, an insulating layer 2CON and an insulating layer PDL. The insulating layer 1CON may be disposed on the substrate 200. The insulating layer 2CON may be disposed on the insulating layer 1CON, and may include a first opening 252 overlapping with the first pad 212. The insulating layer PDL may be disposed on the insulating layer 2CON, and may include a second opening 262 overlapping with the second pad 222. In some embodiments, the first opening 252 has a depth D1, and the second opening 262 has a depth D2. The depth D1 of the first opening 252 and the depth D2 of the second opening 262 may be in a range of 0 µm to 20 µm, but is not limited thereto. It should be noted that the depth D1 and the depth D2 are defined as a distance from a bottom of an opening (i.e., the first opening 252 and the second opening 262) to a top of an insulating layer (i.e., the insulating layer 2COL and the insulating layer PDL) on a cross section (i.e., along the X axis). In some embodiments, the depth D1 of the first opening 252 and the depth D2 of the second opening 262 may be different. In some embodiments, the first opening 252 has an aperture diameter R1, and the second opening 262 has an aperture diameter R2. The aperture diameter R1 of the first opening 252 and the aperture diameter R2 of the second opening 262 may be in a range of 10 µm to 200 µm, but is not limited thereto. It should be noted that the shapes of the first opening 252 and the second opening 262 are not limited. The aperture diameter R1 and the aperture diameter R2 are defined as the largest width of the bottom of an opening (i.e., the first opening 252 and the second opening 262). The size of the aperture diameter of the opening may be observed by looking down the electronic device 20 through an optical microscope (OM), or by observing a cross section of the electronic device 20 through a scanning electron microscope (SEM). In some embodiments, the aperture diameter R1 of the first opening 252 and the aperture diameter R2 of the second opening 262 may be different.

In some embodiments, the conducting layer M3 includes a third pad 272 in the active region. The electronic device 20 may further include a third electronic component 280. The third electronic component 280 may be disposed on the third pad 272, and may include a third pin 282. The third electronic component 280 is electronically connected to the third pad 272 via the third pin 282.

In some embodiments, the electronic device 20 may use the conducting layer M2 and the first electronic component 230 disposed on the first pad 212 to perform a mass LED transfer. The first electronic component 230, disposed on the first pad 212 and electronically connected to the first pad 212, may be a LED chip. The electronic device 20 may use the conducting layer M4 and the second electronic component 240 disposed on the second pad 222 to perform a repair. The second electronic component 240, disposed on the second pad 222 and electronically connected to the second pad 222, may be a repaired LED chip. For example, when the state of the first electronic component 230 is a defective state, a laser cutting is used to make the electronic component 230 in a floating state. Then, the second electronic component 240 is disposed on the second pad 222, and a laser welding is performed to repair the electronic device 20. The electronic device 20 may use the conducting layer M3 and the third electronic component 280 disposed on the third pad 272 to perform other chip transfer (e.g., a sensor chip transfer), but is not limited thereto. The third electronic component 280, disposed on the third pad 272 and electronically connected to the third pad 272, may be a sensor chip.

Figure 3:
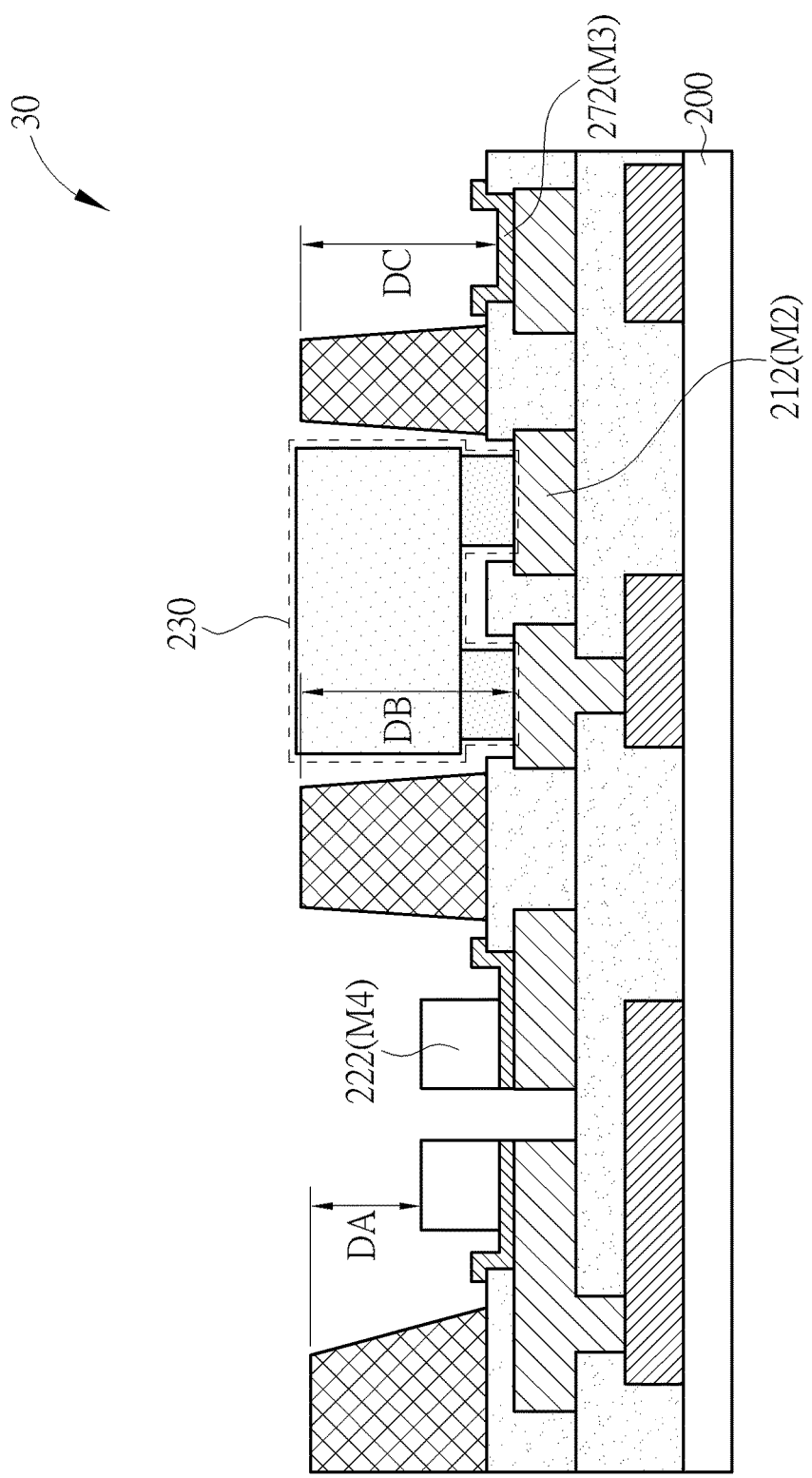
FIG. 3 shows an electronic device according to the embodiment of the present disclosure.

FIG. 3 shows an electronic device 30 according to the embodiment of the present disclosure. The electronic device 30 may use the conducting layer M2 and the first electronic component 230 disposed on the first pad 212 to perform the mass LED transfer. In the electronic device 30, the first electronic component 230, disposed on the first pad 212 and electronically connected to the first pad 212, may be a LED chip.

In addition, in some embodiments, a depth DA may be a distance from the top of the insulating layer PDL to the second pad 222 on a cross section. A depth DB may be a distance from the top of the insulating layer PDL to the first pad 212 on a cross section. The depth DA and the depth DB may be in a range of 0 µm to 20 µm, but is not limited thereto. In some embodiments, a height of the first electronic component 230 may be substantially the same as the depth DB. That is, a top surface of the first electronic component 230 may be substantially at the same level as a top surface of the insulating layer PDL. In some embodiments, a height of the second electronic component 240 may be larger than the depth DA. That is, the top surface of the first electronic component 230 may protrude the top surface of the insulating layer PDL, but is not limited thereto. A depth DC may be a distance from the top of the insulating layer PDL to the third pad 272 on a cross section. The depth DC may be in a range of 0 µm to 20 µm, but is not limited thereto. In some embodiments, the depth DA is smaller than the depth DC, and the depth DC is smaller than the depth DB, nut is not limited thereto.

Figure 4:
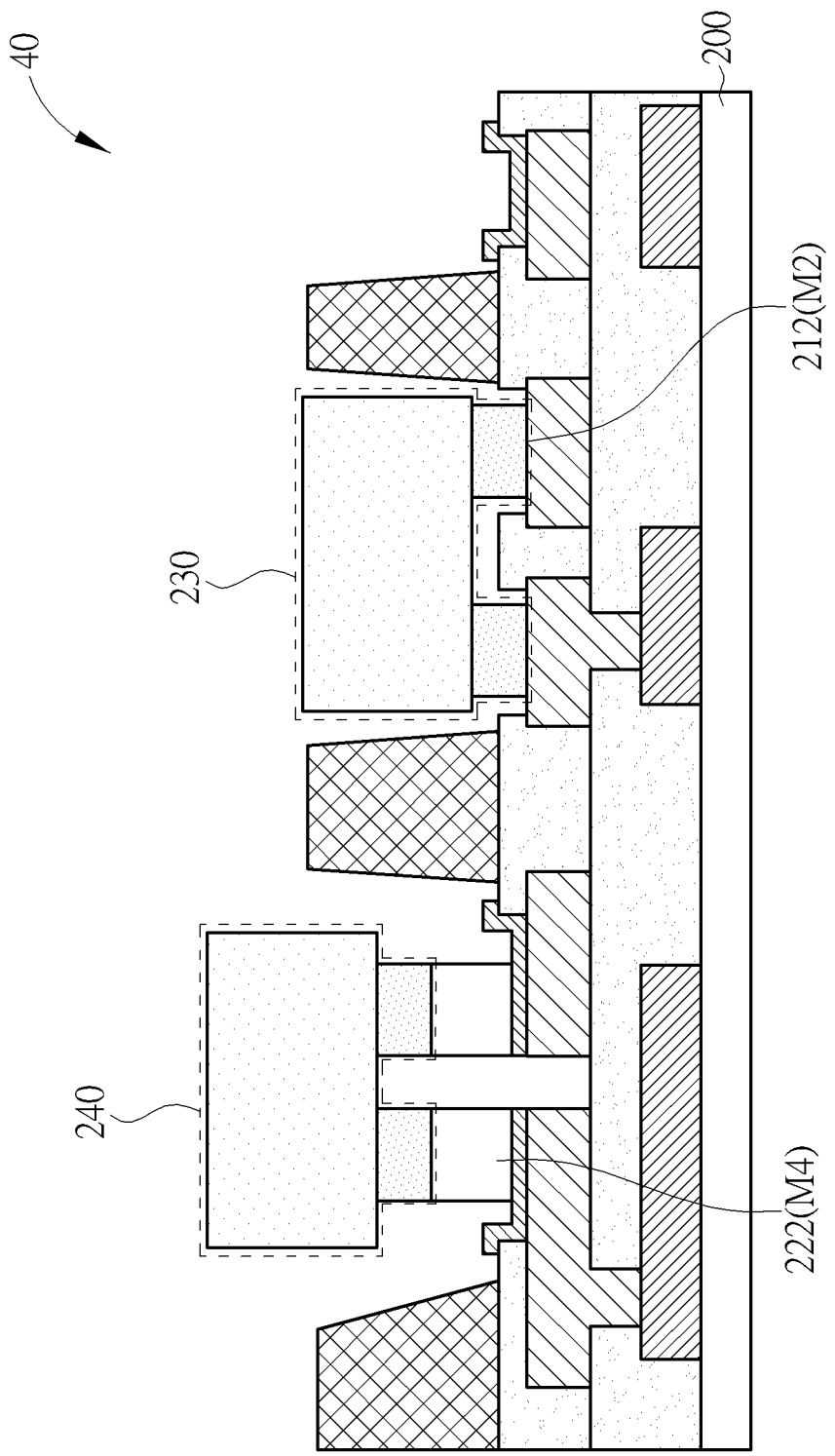
FIG. 4 shows an electronic device according to the embodiment of the present disclosure.

FIG. 4 shows an electronic device 40 according to the embodiment of the present disclosure. In addition to using the conducting layer M2 and the first electronic component 230 disposed on the first pad 212 to perform the mass LED transfer, the electronic device 40 may further use the conducting layer M4 and the second electronic component 240 disposed on the second pad 222 to repair a LED. In the electronic device 40, the first electronic component 230, disposed on the first pad 212 and electronically connected to the first pad 212, may be a LED chip. The second electronic component 240, disposed on the second pad 222 and electronically connected to the second pad 222, may be a repaired LED chip. For example, when the state of the first electronic component 230 is a defective state, a laser cutting is used to make the electronic component 230 in a floating state. Then, the first electronic component 230 is replaced with the second electronic component 240, to repair the electronic device 40. In some embodiments, the first electronic component 230 may be disposed on the first pad 212 for the mass LED transfer, and the second electronic component 240 may be disposed on the second pad 222 for another mass LED transfer, but is not limited thereto.

Figure 5:
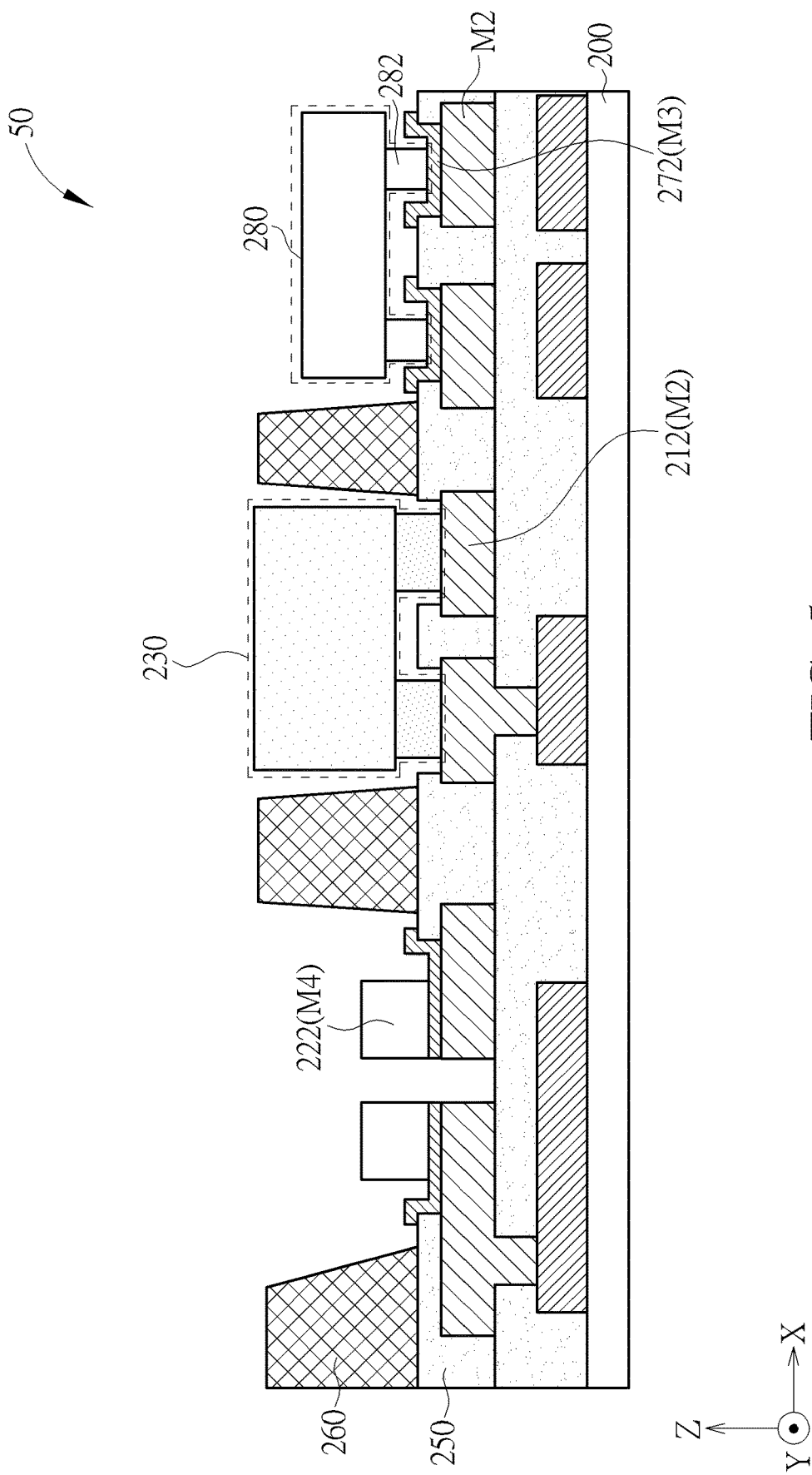
FIG. 5 shows an electronic device according to the embodiment of the present disclosure.

FIG. 5 shows an electronic device 50 according to the embodiment of the present disclosure. In addition to using the conducting layer M2 and the first electronic component 230 disposed on the first pad 212 to perform the mass LED transfer, the electronic device 50 may further use the conducting layer M3 and the third electronic component 280 disposed on the third pad 272 to perform other chip transfer (e.g., a sensor chip transfer), but is not limited thereto. In the electronic device 50, the first electronic component 230, disposed on the first pad 212 and electronically connected to the first pad 212, may be a LED chip. The third electronic component 280, disposed on the third pad 272 and electronically connected to the third pad 272, may be a sensor chip.

Figure 6A:
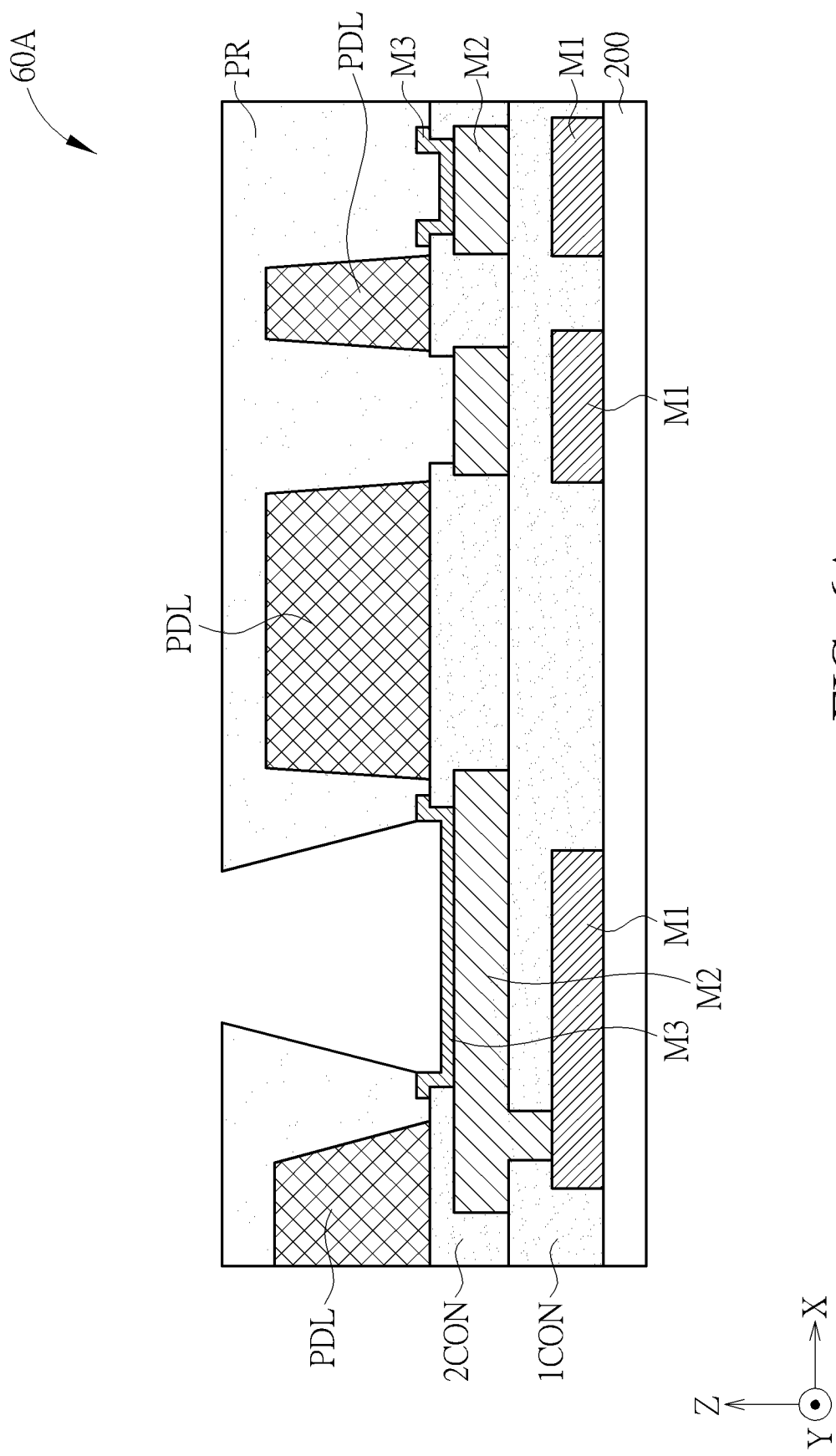
FIG. 6A and FIG. 6B show a manufacture process of an electronic device according to the embodiment of the present disclosure.
Figure 6B:
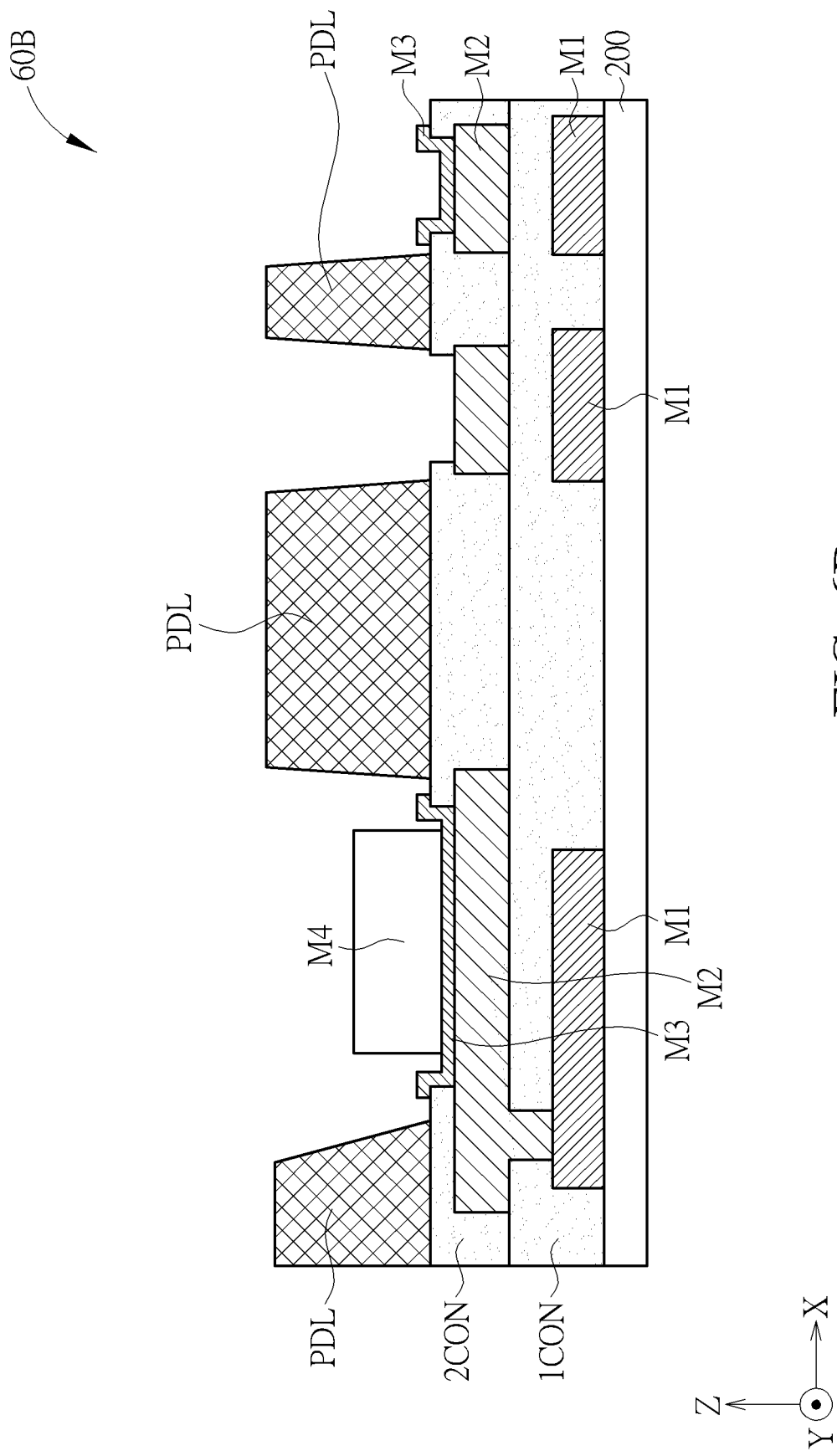

FIG. 6A and FIG. 6B show a manufacture process 60 of an electronic device according to the embodiment of the present disclosure. In the manufacture process 60, conducting layers of different metal configurations on a substrate are formed by means of an evaporation method and a lift-off method. The manufacture process 60 includes a manufacture process 60A and a manufacture process 60B. The manufacture process 60 may be used for producing the electronic device 20, electronic device 30, electronic device 40 and electronic device 50 described above. The manufacture process 60A may be used for producing electronic devices with the following steps: forming the conducting layer M1 on the substrate 200; forming the insulating layer 1CON on the substrate 200 and the conducting layer M1; forming the conducting layer M2 on the insulating layer 1CON; forming the insulating layer 2CON on the insulating layer 1CON and the conducting layer M2; forming the conducting layer M3 on the conducting layer M2 and the insulating layer 2CON; forming the insulating layer PDL on the insulating layer 2CON; and forming a special photoresist PR on the insulating layer 2CON, the conducting layer M2, the conducting layer M3 and the insulating layer PDL. The manufacture process 60B continues the steps of the manufacture process 60A: forming the conducting layer M4 via the evaporation method; and removing the special photoresist PR. The method of removing the special photoresist PR may be a lift-off process, but is not limited thereto. The conducting layers with three different metal configurations of the electronic device may be completed according to the steps of the manufacture process 60A and the manufacture process 60B describe above. In the manufacture process 60, the conducting layer M1 may include molybdenum, aluminum and other suitable material or a combination of the above, but is not limited thereto. The conducting layer M2 may be molybdenum, copper and other suitable material or a combination of the above, but is not limited thereto. The Conducting layer M3 may include titanium, but is not limited thereto. The insulating layer 1CON and the insulating layer 2CON may include silicon nitride, but is not limited thereto.

Figure 7A:
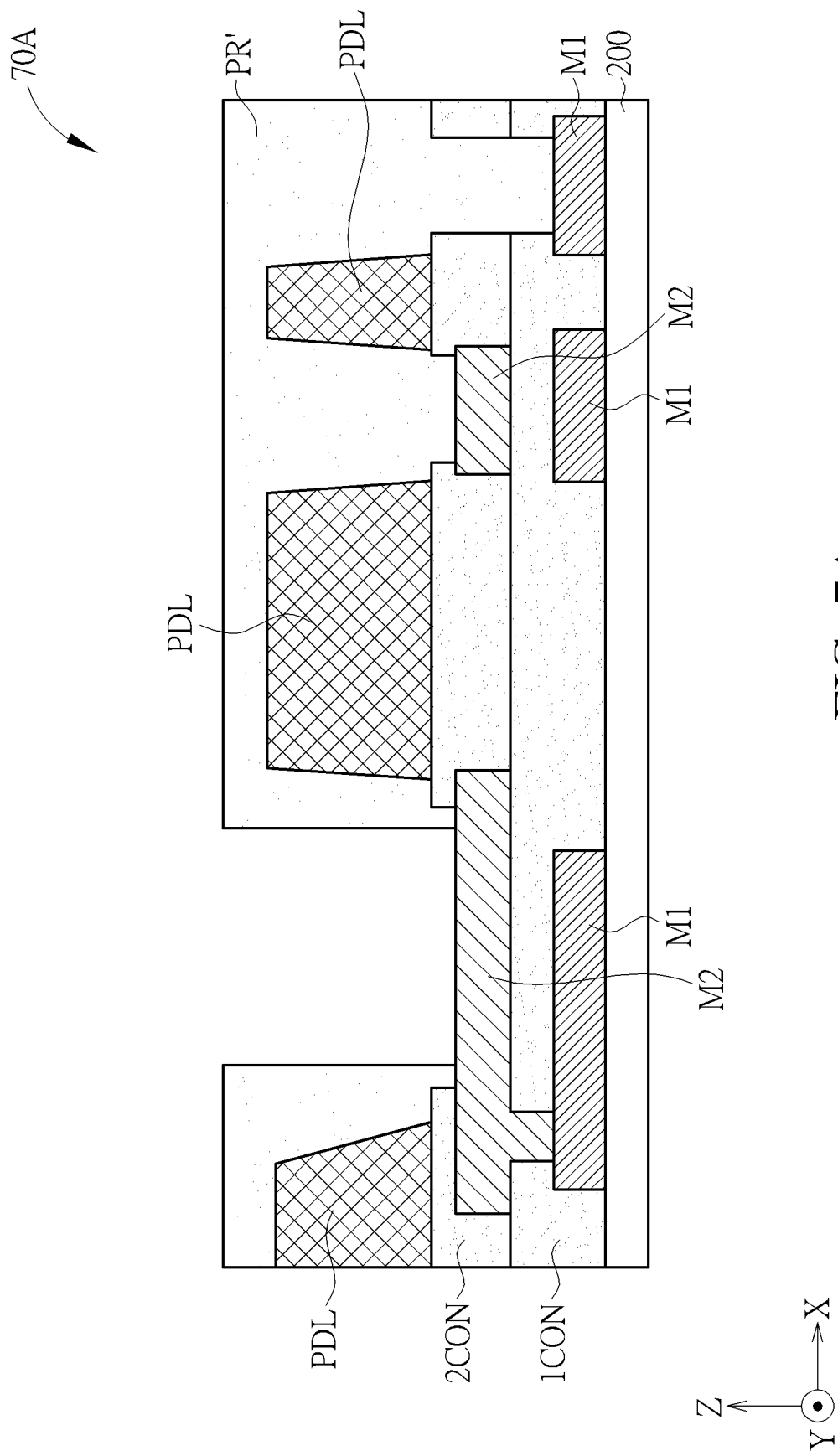
FIG. 7A and FIG. 7B show a manufacture process of an electronic device according to the embodiment of the present disclosure.
Figure 7B:
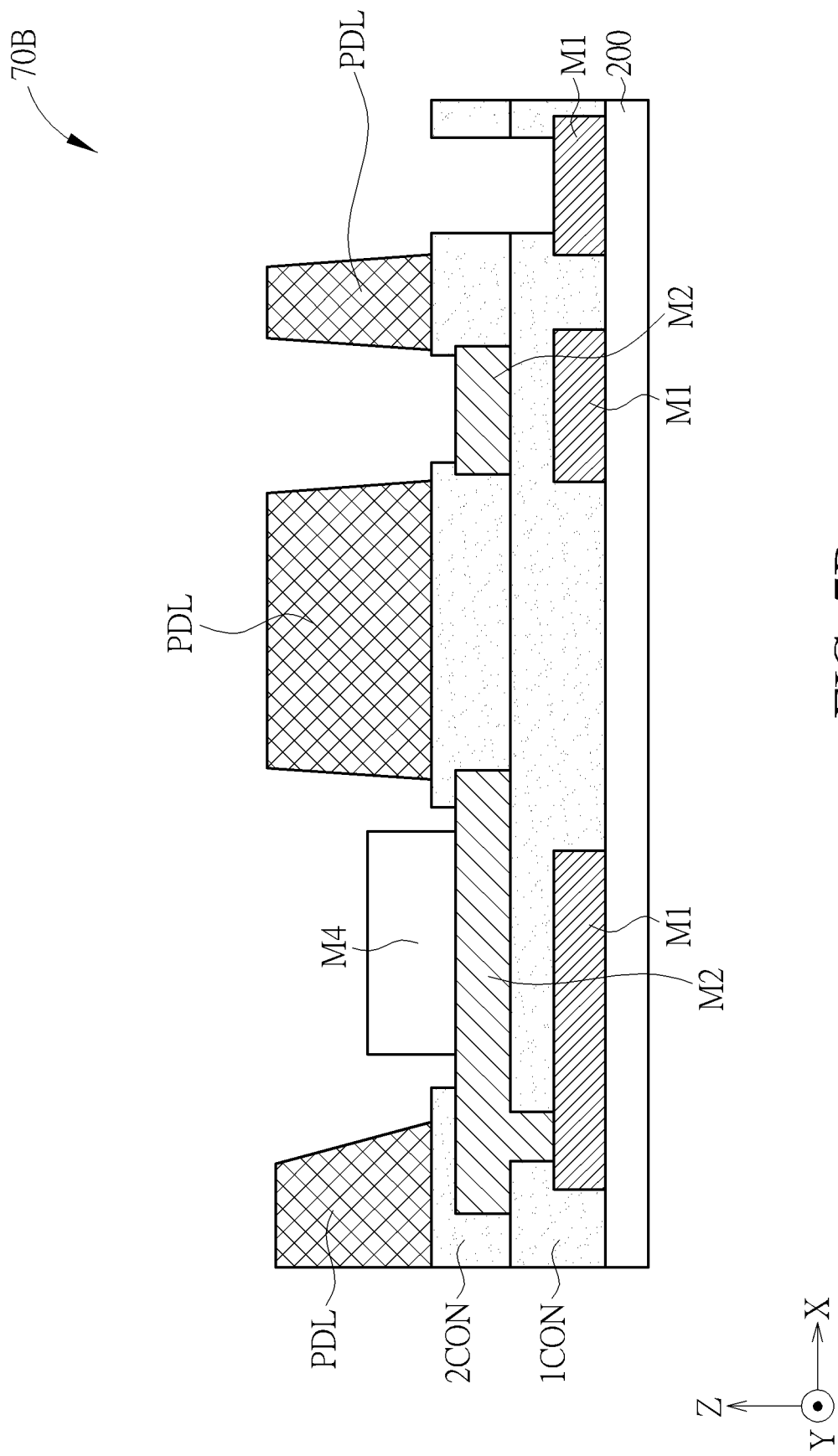

FIG. 7A and FIG. 7B show a manufacture process 70 of an electronic device according to the embodiment of the present disclosure. In the manufacture process 70, conducting layers of different metal configurations on a substrate are formed by means of a chemical plating process. The manufacture process 70 includes a manufacture process 70A and a manufacture process 70B. The manufacture process 70 may be used for producing the electronic device 20, electronic device 30, electronic device 40 and electronic device 50 described above. The manufacture process 70A may be used for producing electronic devices with the following steps: forming the conducting layer M1 on the substrate 200; forming the insulating layer 1CON on the substrate 200 and the conducting layer M1; forming the conducting layer M2 on the insulating layer 1CON; forming the insulating layer 2CON on the insulating layer 1CON and the conducting layer M2; forming the insulating layer PDL on the insulating layer 2CON; and forming a photoresist PR' on the insulating layer 2CON, the conducting layer M1, the conducting layer M2 and the insulating layer PDL. The manufacture process 70B continues the steps of the manufacture process 70B: forming the conducting layer M4 via the chemical plating process; and removing the photoresist PR' with a stripper. The conducting layers with three different metal configurations of the electronic device may be completed according to the steps of the manufacture process 70A and the manufacture process 70B describe above. In the manufacture process 70, the conducting layer M1 may include molybdenum, aluminum and other suitable material or a combination of the above, but is not limited thereto. The conducting layer M2 may be molybdenum, copper and other suitable material or a combination of the above, but is not limited thereto. The insulating layer 1CON and the insulating layer 2CON may include silicon nitride, but is not limited thereto.

Figure 8:
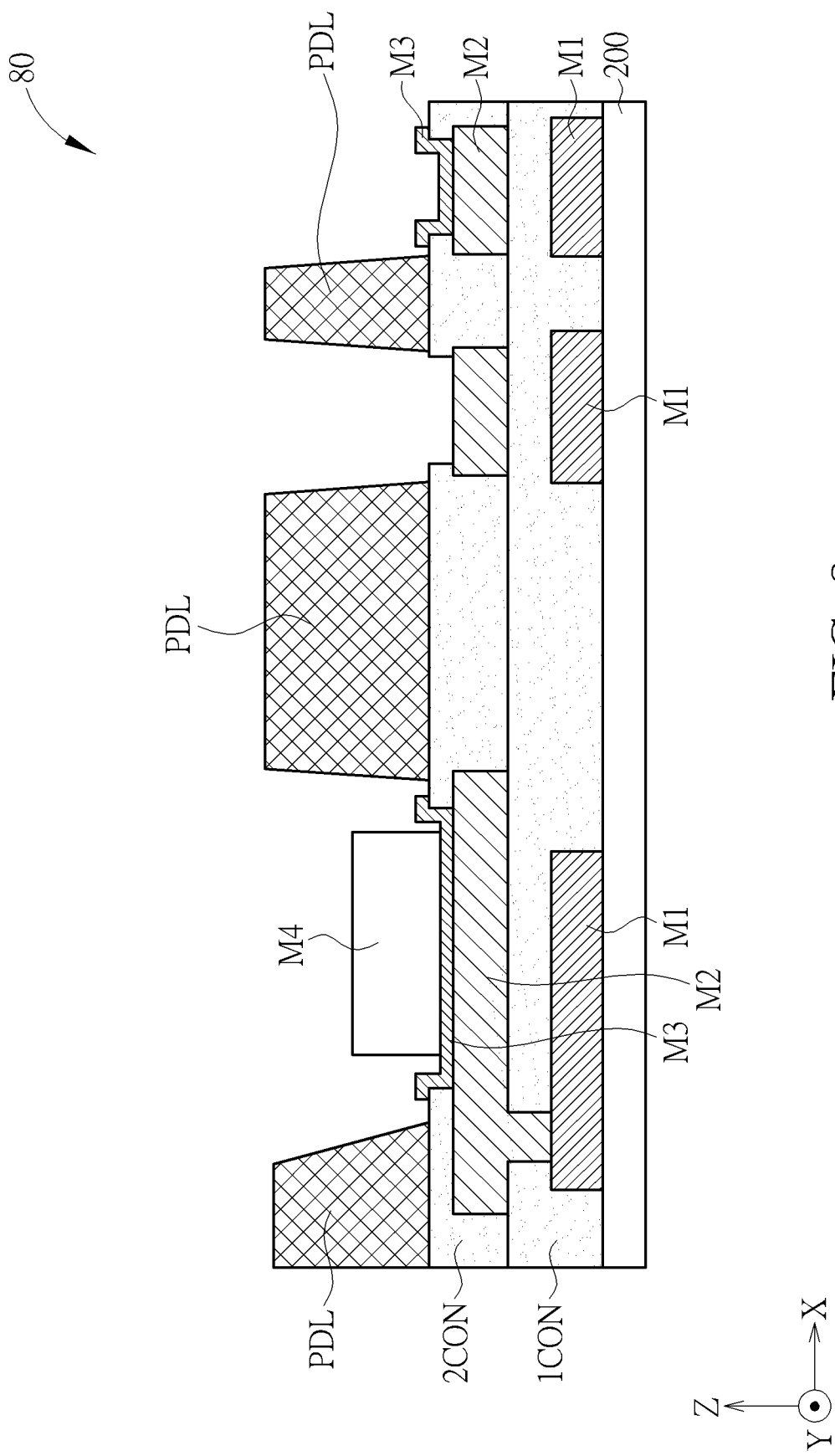
FIG. 8 shows a manufacture process of an electronic device according to the embodiment of the present disclosure.

FIG. 8 shows a manufacture process 80 of an electronic device according to the embodiment of the present disclosure. In the manufacture process 80, conducting layers of different metal configurations on a substrate are formed by means of a sputter process. The manufacture process 80 may be used for producing the electronic device 20, electronic device 30, electronic device 40 and electronic device 50 described above. The manufacture process 80 may be used for producing electronic devices with the following steps: forming the conducting layer M1 on the substrate 200; forming the insulating layer 1CON on the substrate 200 and the conducting layer M1; forming the conducting layer M2 on the insulating layer 1CON; forming the insulating layer 2CON on the insulating layer 1CON and the conducting layer M2; forming the conducting layer M3 on the conducting layer M2 and the insulating layer 2CON; forming the insulating layer PDL on the insulating layer 2CON; and forming the conducting layer M4 on the conducting layer M3. The conducting layers with three different metal configurations of the electronic device may be completed according to the steps of the manufacture process 80 describe above. In the manufacture process 80, the conducting layer M1 may include molybdenum, aluminum and other suitable material or a combination of the above, but is not limited thereto. The conducting layer M2 may be molybdenum, copper and other suitable material or a combination of the above, but is not limited thereto. The Conducting layer M3 may include titanium, but is not limited thereto. The insulating layer 1CON and the insulating layer 2CON may include silicon nitride, but is not limited thereto.

Figure 9:
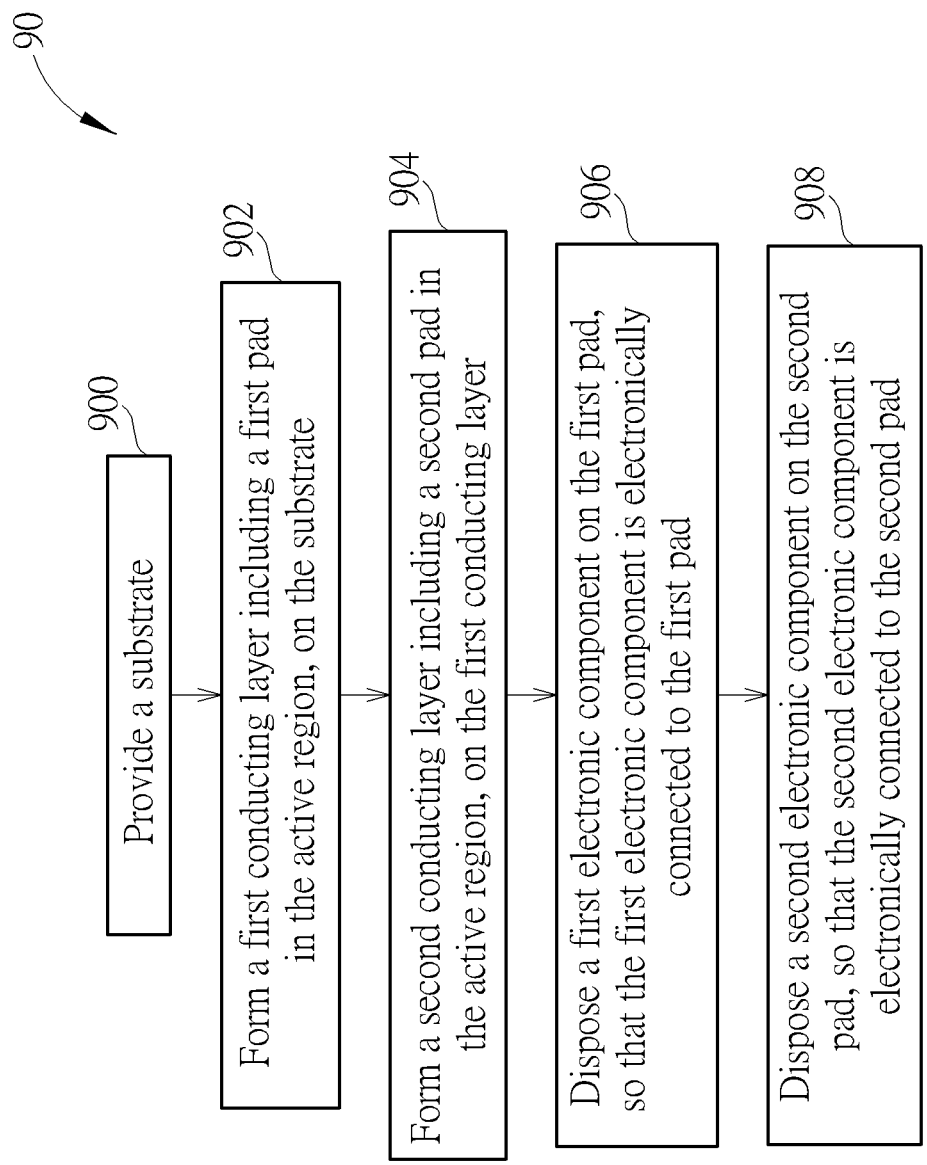
FIG. 9 shows a flowchart of a process of a method for producing an electronic device according to the embodiments of the present disclosure.

FIG. 9 shows a flow chart of a process 90 of a method for producing an electronic device according to the embodiments of the present disclosure. The process 90 may be used for producing the electronic device 20, electronic device 30, electronic device 40 and electronic device 50 described above, and includes the following steps:

Step 900: Provide a substrate.

Step 902: Form a first conducting layer including a first pad in the active region, on the substrate.

Step 904: Form a second conducting layer including a second pad in the active region, on the first conducting layer.

Step 906: Dispose a first electronic component on the first pad, so that the first electronic component is electronically connected to the first pad.

Step 908: Dispose a second electronic component on the second pad, so that the second electronic component is electronically connected to the second pad.

In some embodiments, the first electronic component 230 is disposed on the first pad 212 via a fluid transfer method. In some embodiments, the second electronic component 240 is disposed on the second pad 222 via a pick-and-place method. In some embodiments, when the state of the first electronic component 230 is the defective state, a laser cutting process is performed, so that the first pad 212 is in a floating state.

The following embodiments may be applied to FIG. 1 to FIG. 9.

In some embodiments, the electronic devices 20-50 may be bendable electronic devices or flexible electronic devices. The electronic devices 20-50 may include LEDs. The LEDs may include an organic LED (OLED), a mini LED, a micro LED, a quantum dot (QD) LED (QDLED), a fluorescence, a phosphor, other suitable materials or a combination of the above, but is not limited thereto.

In some embodiments, the substrate 200 may be an array substrate. In some embodiments, the substrate 200 may include a polarizer, a thin film transistor (TFT) substrate, a capacitor, a TFT, an integrated circuit (IC), an indium-tin oxide (ITO) pixel polar or a combination of the above. In some embodiments, the substrate 200 may be a color filter array (COA) substrate, but is not limited thereto.

The substrate 200 described in the disclosure includes a rigid substrate, a flexible substrate or a combination of the above. For example, the material of the substrate 200 may include glass, quartz, sapphire, acrylic resin, polycarbonate (PC), polyimide (PI), polyethylene terephthalate (PET), other suitable transparent material or a combination of the above, but is not limited thereto.

It should be noted that the technical features in different embodiments described above may be mixed with one another to constitute another embodiment without departing from the spirit of the present disclosure or conflicting with each other.

In summary, the disclosure provides an electronic device for integrating multiple pads on a substrate. The user may perform different mass transfers on a same substrate via various pads of different metal configurations included in the electronic device. The steps and the cost required for the mass transfers are saved since multiple substrates are not necessary. Thus, the problem in the art may be solved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device with an active region, comprising:
    a substrate;
    a first conducting layer, disposed on the substrate, comprising a first pad in the active region;
    a second conducting layer, disposed on the first conducting layer, comprising a second pad in the active region;
    a first electronic component, disposed on the first pad, and electronically connected to the first pad; and
    a second electronic component, disposed on the second pad, and electronically connected to the second pad;
    wherein the first pad and the second pad comprise different materials.

2. The electronic device of claim 1, wherein a first state of the first electronic component is a normal state, and a second state of the second electronic component is a defective state; or the first state of the first electronic component is the defective state, and the second state of the second electronic component is the normal state.

3. The electronic device of claim 1, wherein a first thickness of the first pad and a second thickness of the second pad are different.

4. The electronic device of claim 1, further comprising:
    a first insulating layer, disposed on the substrate, comprising a first opening overlapping with the first pad; and
    a second insulating layer, disposed on the substrate, comprising a second opening overlapping with the second pad.

5. The electronic device of claim 4, wherein a first depth of the first opening and a second depth of the second opening are different.

6. The electronic device of claim 4, wherein a first aperture diameter of the first opening and a second aperture diameter of the second opening are different.

7. A method of producing an electronic device with an active region, comprising:
    providing a substrate;
    forming a first conducting layer comprising a first pad in the active region, on the substrate;
    forming a second conducting layer comprising a second pad in the active region, on the first conducting layer;
    disposing a first electronic component on the first pad, so that the first electronic component is electronically connected to the first pad; and
    disposing a second electronic component on the second pad, so that the second electronic component is electronically connected to the second pad,
    wherein a first state of the first electronic component is a normal state, and a second state of the second electronic component is a defective state; or the first state of the first electronic component is the defective state, and the second state of the second electronic component is the normal state,
    wherein when the first state of the first electronic component is the defective state, the method further comprises:
        performing a laser cutting process, so that the first pad is in a floating state.

8. The method of claim 7, wherein the first electronic component is disposed on the first pad via a fluid transfer method.

9. The method of claim 7, wherein the second electronic component is disposed on the second pad via a pick-and-place method.

10. An electronic device with an active region, comprising:
    a substrate;
    a first conducting layer, disposed on the substrate, comprising a first pad in the active region;
    a second conducting layer, disposed on the first conducting layer, comprising a second pad in the active region;
    a first electronic component, disposed on the first pad, and electronically connected to the first pad; and
    a second electronic component, disposed on the second pad, and electronically connected to the second pad,
    wherein a first thickness of the first pad and a second thickness of the second pad are different.

* * * * *